United States Patent [19]

Noever

[11] Patent Number: 5,256,241

[45] Date of Patent: Oct. 26, 1993

[54] METHOD FOR CONTROLLING PROTEIN CRYSTALLIZATION

[75] Inventor: David A. Noever, Belle Mina, Ala.

[73] Assignee: The United States of America as represented by the Administrator of the National Aeronautics and Space Administration, Washington, D.C.

[21] Appl. No.: 936,376

[22] Filed: Aug. 28, 1992

[51] Int. Cl.⁵ .............................................. C30B 7/02
[52] U.S. Cl. ..................................... 156/600; 156/621; 156/622; 422/245; 23/295 R
[58] Field of Search ................. 422/245; 156/600, 621, 156/622, DIG. 113; 23/295 R; 530/427

[56] References Cited

U.S. PATENT DOCUMENTS

| | | | |
|---|---|---|---|
| 4,886,646 | 12/1989 | Carter et al. | 422/245 |
| 4,919,899 | 4/1990 | Herrmann et al. | 422/245 |
| 5,009,861 | 4/1991 | Plaas-Link | 422/245 |
| 5,104,478 | 4/1992 | Sikdar et al. | 156/600 |
| 5,106,592 | 4/1992 | Stapelmann et al. | 422/245 |
| 5,139,611 | 8/1992 | Pusey et al. | 156/621 |
| 5,190,613 | 3/1993 | Yamagata | 156/600 |

Primary Examiner—James C. Housel
Assistant Examiner—Rachel Freed
Attorney, Agent, or Firm—Robert L. Broad, Jr.; John R. Manning; Guy M. Miller

[57] ABSTRACT

A method for controlling the crystallization of protein by solvent evaporation including placing a drop of protein solution between and in contact with a pair of parallel plates and driving one of the plates toward and away from the other plate in a controlled manner to adjust the spacing between the plates. The drop of solution forms a liquid cylinder having a height dependent upon the plate spacing thereby effecting the surface area available for solvent evaporation. When the spacing is close, evaporation is slow. Evaporation is increased by increasing the spacing between the plates until the breaking point of the liquid cylinder. One plate is mounted upon a fixed post while the other plate is carried by a receptacle movable relative to the post and driven by a belt driven screw drive. The temperature and humidity of the drop of protein solution are controlled by sealing the drop within the receptacle and mounting a heater and dessicant within the receptacle.

2 Claims, 1 Drawing Sheet

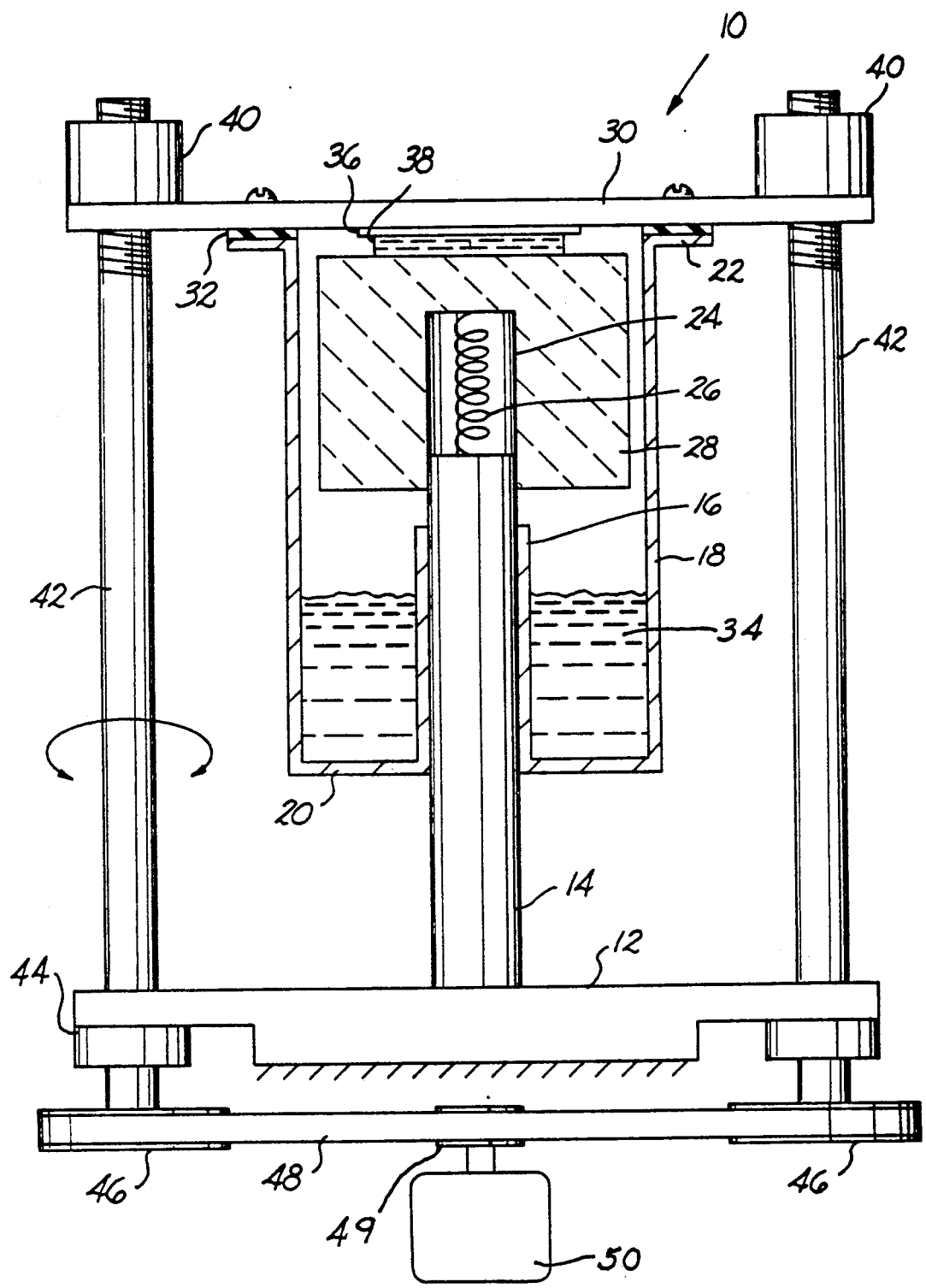

METHOD FOR CONTROLLING PROTEIN CRYSTALLIZATION

ORIGIN OF THE INVENTION

The invention described herein was made by an employee of the United States Government and may be manufactured and used by or for the Government for Governmental purposes without the payment of any royalties thereon or therefor.

BACKGROUND OF THE INVENTION

This invention relates to a method and apparatus for controlling the evaporation of a protein solution for achieving successful protein crystallizations, and more particularly to a method and apparatus for shaping a drop of protein solution between a pair of plates by varying the spacing between the plates so as to control the evaporation of the protein solution.

Protein crystalization to obtain high quality protein crystals is a necessary step in determining the three dimensional atomic structure of proteins. Knowledge of such structures is required for investigating and developing pharmaceutical products possessing unique therapeutic qualities. Additionally, genetic engineering has opened up the possibility of synthesizing proteins once an existing structure is known.

The most popular method for crystallizing proteins is solvent evaporation. The protein is combined with a precipitating agent and the equilibrating solution is allowed to evaporate slowly and hence concentrate the protein beyond its solubility limits. Nucleation and crystal growth follow. The method is flexible enough to encompass many solution set-ups, including a drop hanging from a plate, a drop sitting on a platform and the intermediate case of a drop sandwiched between two plates.

As more protein reproducible protein crystallizations are sought, dynamic control of evaporation is required. Approaches based on humidity control or osmotic behavior have been proposed which give greater control over the rate of protein crystallization. These proposals are directed to better control liquid evaporation and solution conditions through humidity regulations, dialysis and gel growth. The principle drawbacks of these approaches is that they require more elaborate solution preparations (gels) and rely on considerable electronic sensing and hardware to provide the humidity control. Although designed to accommodate many evaporation profiles, one aim of these efforts is to maintain high protein supersaturations early and thus to generate initial nucleation, but subsequently to slow evaporation and avoid multiple nucleations which can compete with the growth of a few high-quality protein crystals. This dynamic profile of evaporation, initially fast and subsequently slow, is presently achievable using only humidity control.

SUMMARY OF THE INVENTION

Consequently, it is an object of the present invention to provide a simple method and apparatus for achieving successful protein crystallizations by using active drop shaping to control the dynamic profile of evaporation and protein supersaturations.

It is another object of the present invention to provide a method and apparatus for controlling protein crystallization by placing a protein solution between and in contact with a pair of plates and thereafter adjusting the spacing between the plates and thus the surface area of the solution available for solvent evaporation.

It is a further object of the present invention to provide a method and apparatus for varying the spacing between a pair of plates between which a drop of protein solution is disposed thereby to control readily and inexpensively the protein crystallization conditions.

Accordingly, the present invention provides a method and apparatus for controlling protein crystallization comprising placing a drop of protein solution between a pair of parallel plates and controllably driving one of the plates toward and away from the other plate to adjust the spacing between the plates. When a drop of the solution is placed between and in abutting relation with the plates it forms a liquid cylinder with a height dependent upon the plate spacing. The spacing thus determines the surface area available for solvent evaporation. Evaporation is slowed by spacing the plates closer, and evaporation is increased by increasing the spacing between the plates until the liquid cylinder breaking point where the plate spacing is equal to the circumference of the liquid cylinder. Temperature is controlled by a heater associated with one of the plates and humidity is controlled by a dessicant. At a fixed temperature and humidity, the spacing between the plates and the liquid geometry are the only mechanical determinants of evaporation. Thus, protein crystallization can be precisely controlled by controlling the evaporation profile. Initial nucleation may be generated at a high evaporation rate by spacing plates further apart and once nucleation is detected, the plate spacing can be narrowed to slow subsequent evaporation and suppress further nuclei from forming.

BRIEF DESCRIPTION OF THE DRAWING

The particular features and advantages of the invention as well as other objects will become apparent from the following description taken in connection with the accompanying drawing in which:

The FIGURE is a diagrammatic view of apparatus constructed in accordance with the principles of the present invention for controlling protein crystallization.

DESCRIPTION OF THE PREFERRED EMBODIMENT

Referring to the drawing, apparatus 10 for controlling protein crystallization in accordance with the present invention includes a fixed base member 12 which, as illustrated, may be disposed horizontally. Secured to the base member 12 is an upstanding post 14 preferably of a cylindrical configuration. The post 14 is slidably received within an annular sleeve 16 of a cylindrical housing 18, the housing 18 having a radial wall 20 at one end to close that end except or the opening in the sleeve 16, and being open at its other end. The interior of the housing 18 thus forms a receptacle disposed about the sleeve 16 and the post 14 which extends therethrough.

Extending about the open end of the housing 18 is an integral flange 22. Disposed within the post 14 at its upper end is a heater 24 including a heating element 26 for purposes which will hereinafter be made clear. Secured within the housing 18 about the upper end of the post 14 and the heater 24 is a cylindrical plate 28 known as a sting, the plate or sting 28 preferably being formed from glass, or alternately, although not illustrated, it may be formed from another material and support a glass plate or slide on its upper surface.

Positioned above the flange 22 is a plate 30, which has a larger diameter than that of the flange 22. A gasket 32 is disposed intermediate the flange 22 and the plate 30 and the plate is secured to the flange. The gasket ensures that the temperature and humidity within the receptacle 18 may be controlled by the heater 24 and by the use of a liquid dessicant 34 such as ammonium sulfate within the receptacle, or alternatively, a solid dessicant. In either case, the temperature and humidity within the receptacle may be maintained substantially constant. The plate 30 may be formed from glass, but preferably a glass plate 36 may be fastened to and carried by the upper surface of the plate 30 facing the sting 28. A drop of protein solution may then be placed on the sting 28 to form a liquid cylinder 38. The height of the cylinder formed is then dependent only upon the spacing between the sting 28 and the plate 36 which remain in contact with the liquid drop. The distance or spacing between the sting and the plate 36 then determines the surface area available for solvent evaporation.

Although any of a number of systems may be devised to precisely move the plate 30 and thus the plate 36 relative to the sting 28, a screw drive construction has been illustrated. Thus, the plate 30 includes at least one internally threaded boss or nut member 40 secured to the plate 30, member 40 threadedly receiving one end of a screw 42, the other end of which is constrained against axial movement by a bearing 44 within which the screw may rotate. A pulley 46 may be fastened to each screw 42 at, the end supported by the bearing 44. A belt 48 connects the pulleys 46 and 49 which may be selectively and precisely driven by a motor 50, which may be a stepping motor, a servo-motor, or the like. Thus, rotation of the motor 50 in either direction will rotate the screw 42 to drive the plate 30 either upwardly or downwardly to increase or decrease the space between the plate 36 and the sting 28.

By precisely adjusting the space between the plate 36 and the sting 28, solvent evaporation may be controlled to control the evaporation profile. Closer spacings slow evaporation and hence achieve a reduced driving force for crystallization, while larger spacings speed evaporation until the cylinder breaking point, i.e., the Rayleigh limit, where the plate spacing equals the circumference of the fluid cylinder. Actively and precisely controlling the fluid surface area thereby provides control over the course of protein crystallization.

When compared to existing methods, the present invention provides a mechanically simple design yielding high reliability at lost cost. Moreover, since the plate spacing can be dynamically controlled with great precision, a controller feedback loop can optimize the evaporative driving force for protein crystallization, i.e., the evaporation profile. Solution diagnostics such as monitors for pH, salt and electrical conductance may be readily incorporated into the space between the sting 28 and the plate 36 by incorporating small entry ports in the plate 30. Catastrophic drop dislodgment or large oscillations are effectively minimized by the plates. Additionally, the plate spacing may be varied dynamically to give greater overall resistance to residual vibration such as that which might occur periodically on a spacecraft. In any event, the method and apparatus of the present invention provides a wide and reliable experimental control over protein crystallization conditions at low expense and with great flexibility.

Numerous alterations of the structure herein disclosed will suggest themselves to those skilled in the art. However, it is to be understood that the present disclosure relates to the preferred embodiment of the invention which is for purposes of illustration only and not to be construed as a limitation of the invention. All such modifications which do not depart from the spirit of the invention are intended to be included within the scope of the appended claims.

Having this set forth the nature of the invention, what is claimed herein is:

1. A method for controlling protein crystallization comprising:
    (a) placing a drop of protein solution between two parallel plates so that the solution is engaged by both plates,
    (b) evaporating a solvent from the protein solution engaged by both plates to crystallize the protein, and
    (c) moving one of the plates relative to the other of the plates during evaporation of the solvent to vary the spacing therebetween while maintaining the contract of the drop with both plates thereby to vary a dimension of the drop between the plates and thus the surface area of the drop and the evaporation rate of solvent.

2. The method as recited in claim 1, including maintaining the temperature and humidity of the solution substantially constant.

* * * * *